United States Patent [19]

Cloke

[11] Patent Number: 4,599,570
[45] Date of Patent: Jul. 8, 1986

[54] PHASE DETECTOR WITH INDEPENDENT OFFSET CORRECTION

[75] Inventor: Robert L. Cloke, Santa Clara, Calif.

[73] Assignee: Sperry Corporation, New York, N.Y.

[21] Appl. No.: 400,494

[22] Filed: Jul. 21, 1982

[51] Int. Cl.4 .......................... H03K 5/13; H03K 5/22
[52] U.S. Cl. .................................... 328/155; 328/134; 328/162; 307/511
[58] Field of Search .................. 328/55, 155, 165, 162, 328/163, 133, 134; 307/491, 511, 262, 517; 375/118; 331/1 A, 25

[56] References Cited

U.S. PATENT DOCUMENTS

| | | | |
|---|---|---|---|
| 4,055,814 | 10/1977 | Abraham et al. | 328/133 |
| 4,105,947 | 8/1978 | Crowley | 328/134 |
| 4,222,013 | 9/1980 | Bowers et al. | 328/134 |
| 4,371,974 | 2/1983 | Dugan | 328/133 |
| 4,380,815 | 4/1983 | Clendening | 328/133 |

*Primary Examiner*—Stanley D. Miller
*Assistant Examiner*—Timothy P. Callahan
*Attorney, Agent, or Firm*—John B. Sowell; Thomas J. Scott; Marshall M. Truex

[57] ABSTRACT

A method and apparatus of offset correction which can be applied to control systems, primarily phase-locked-loop systems, and which permits sampling of the error signals for use as an auxiliary input to the system in order to center the error signal around zero.

15 Claims, 8 Drawing Figures

PHASE DETECTOR WITH INDEPENDENT OFFSET CORRECTION

BACKGROUND

1. Field of the Invention

This invention is directed to phase detector systems, in general, and to circuits for automatically nulling the offset error signal frequently found therein, in particular.

2. Prior Art

There are many types of circuits wherein a particular phase or frequency signal is necessary and/or desirable. In order to lock on to this signal, it is frequently found advantageous to use a phase-locked-loop. However, in the past the phase-locked-loop circuits have included various components, for example, operational amplifiers, which produce error signals as a result of offset voltages at the input terminals thereof.

Various approaches and techniques have been utilized in an attempt to avoid or null the offset or error signal. However, these techniques have usually been quite cumbersome and provided as many problems as they have provided solutions. Typically, the initial adjustment to compensate for the error signals is impermanent at best and varies with time, temperature, aging and the like. Consequently, a new technique for avoiding the offset error signal is highly desirable.

SUMMARY OF THE INSTANT INVENTION

This invention uses a standard phase detector circuit together with control circuits which respond to the phase detector circuit to provide auxiliary signals to the output amplifying circuitry to reduce the residual phase error due to the voltage offset of the phase detector and the amplifier itself.

DESCRIPTION OF A PREFERRED EMBODIMENT

Figure 1:
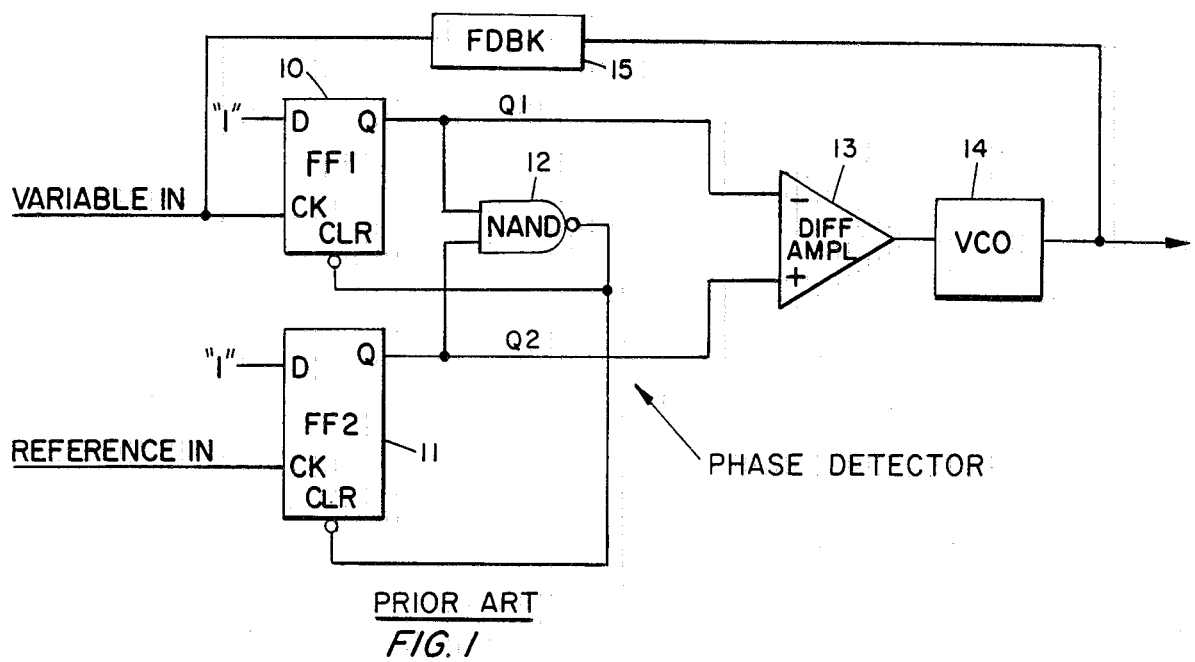
FIG. 1 is a block diagram of the phase detector circuit known in the prior art.

Referring now to FIG. 1, there is shown a block diagram of a phase-locked-loop which includes a phase detector circuit known in the prior art. The circuit comprises flip-flops 10 and 11, NAND gate 12 and difference amplifier 13. In particular, flip-flops 10 and 11 are D-type flip-flops with the D input terminal connected to a positive level which represents a binary 1. The clock terminal of flip-flop 10 is connected to a source which provides a variable input signal while the clock terminal of flip-flop 11 is connected to receive a reference input signal. The Q output terminals of flip-flops 10 and 11 provide the Q1 and Q2 output signals, respectively. In particular, the Q output terminal of flip-flop 10 is connected to one input of NAND gate 12 and to the minus (−) input terminal of difference amplifier 13. The Q output terminal of flip-flop 11 is connected to another input of NAND gate 12 and to the plus (+) input terminal of amplifier 13. Of course, the (+) and (−) terminal connections can be reversed, as required, for negative feedback around the phase-locked-loop, depending upon the characteristics of the output VCO. The output terminal of NAND gate 12 is connected to the clear (CLR) terminals of flip-flops 10 and 11. The output terminal of difference amplifier 13 (which may include an integration function or other frequency response shaping), is connected to a voltage control oscillator 14 to supply control voltage thereto. The output terminal of VCO 14 is returned to the variable-in terminal via a suitable feedback network 15 which can include a frequency divider or any other appropriate circuitry.

Figure 2:
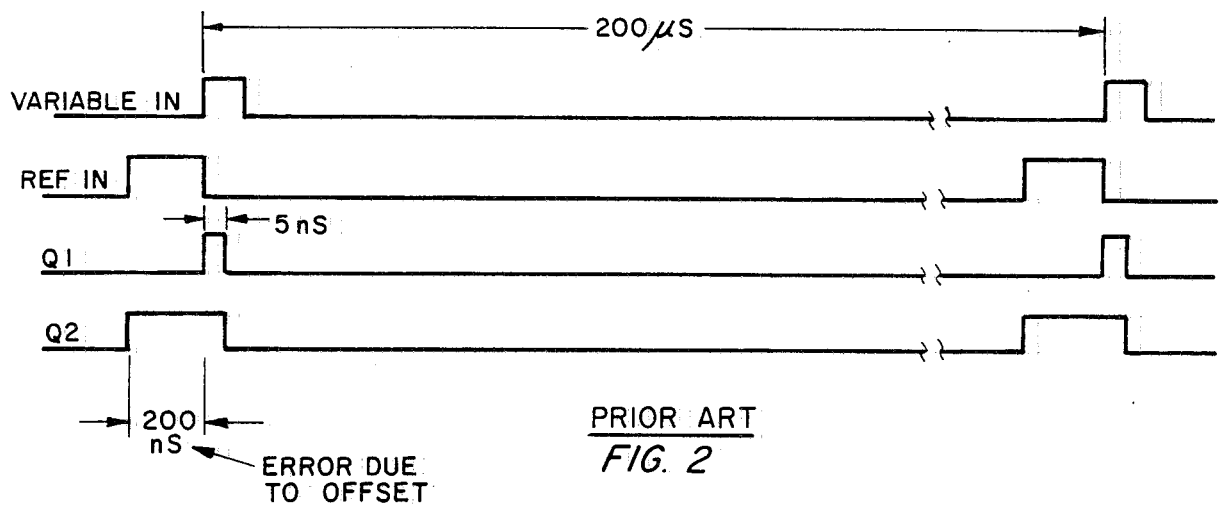
FIG. 2 is a waveform diagram for the circuit of the prior art.

Referring now concurrently to FIGS. 1 and 2, the circuit and its operation are discussed. Signals are supplied to the "variable-in" terminal and to the "reference-in" terminal as shown. In the embodiment shown, the input signals are operative to trigger on the leading or positive going edge thereof.

In the example shown in FIG. 2, the reference input signal precedes the variable input signal. Consequently, when the reference input signal is supplied, the output signal Q2 is generated by flip-flop 11. The signal Q2 is supplied to the NAND gate 12 and to the difference amplifier 13 which begins to operate on the signal thereby to produce the appropriate error or control voltage signal. Subsequently, the variable input signal is supplied to flip-flop 10 and causes signal Q1 to be produced. This signal is supplied to NAND gate 12 and to difference amplifier 13. With the application of the high level Q1 signal to NAND gate 12 which is already receiving the high level Q2 signal, NAND gate 12 produces a low level output signal which clears both flip-flops to the original condition. That is, the output signals Q1 and Q2 revert to the low level.

In addition, the Q1 signal is supplied to difference amplifier 13 concurrent with signal Q2. However, the nature of the circuit operation is that the signal Q1, in this embodiment, is supplied to difference amplifier 13 for a very minimal time. For example, as shown in FIG. 2, signal Q2 is high for a time period of approximately 200 nanoseconds before signal Q1 is received. Once signal Q1 is received, NAND gate 12 triggers rapidly wherein Q1 is changed to the low level in a time period of approximately five nanoseconds. Consequently, the effect of signal Q1 on difference amplifier 13 is minimal. The signal Q2 has a substantial effect, as would be expected in view of the difference of phase of the reference and variable input signals.

In other words, a difference signal is presented on lines Q1 and Q2, i.e., a signal whose difference in average value represents phase error between the input signals. In this case, signal Q2 is high longer than signal Q1 because the reference-in signal arrived before the variable-in signal. (The opposite operating situation can also occur, of course.) The average of the difference produces an analog voltage which is descriptive of the phase difference between the input signals.

However, the problem arises in that small amounts of offset voltage between the quiescent (or low) level of the Q signals are amplified by amplifier 13 as if a time phase difference signal were supplied. Thus, the control voltage is a combination of actual phase error between the input signals and the offset voltages of flip-flops and the amplifier input. Stated differently, it is observed that the Q signals are forced to be of sufficient duration to supply, on the average, the proper voltage to overcome the offset voltage at the input of the difference amplifier 13. That is, the input to difference amplifier 13 comprises the components (1) output voltage divided by the gain of the amplifier, (2) the inherent input offset voltage of the amplifier, and (3) the phase detector output signal differential noted above. The error signals are compensated for by the loop operating in such a manner that a phase error is developed to overcome these offsets and to keep the loop in lock, i.e., to keep the VCO at the proper frequency. Thus, the phase offset shown in FIG. 2 is developed. However, it is desirable to supply offset correction independently of the phase detection circuit so that the loop operates as close as possible to a true null (i.e., zero-error).

Figure 3:
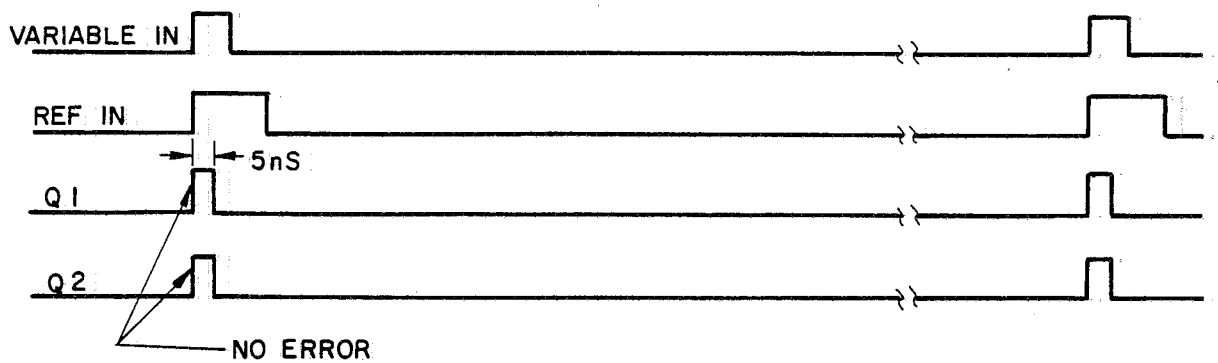
FIG. 3 is a waveform diagram for a phase-locked-loop under idealized operating conditions.

As shown in FIG. 3, the waveforms for a circuit of idealized operation with the offset voltage nulled out are shown. In this illustration, the variable input signal and the reference input signal arrive concurrently and trigger flip-flops 10 and 11 to produce output signals Q1 and Q2, respectively. These output signals immediately trigger NAND gate 12 to terminate the respective signals Q1 and Q2. In this situation, the nulling offset signal is supplied to amplifier circuit 13 by any appropriate means such as adjusting potentiometers, as known in the art, or by using the instant invention.

Figure 4:
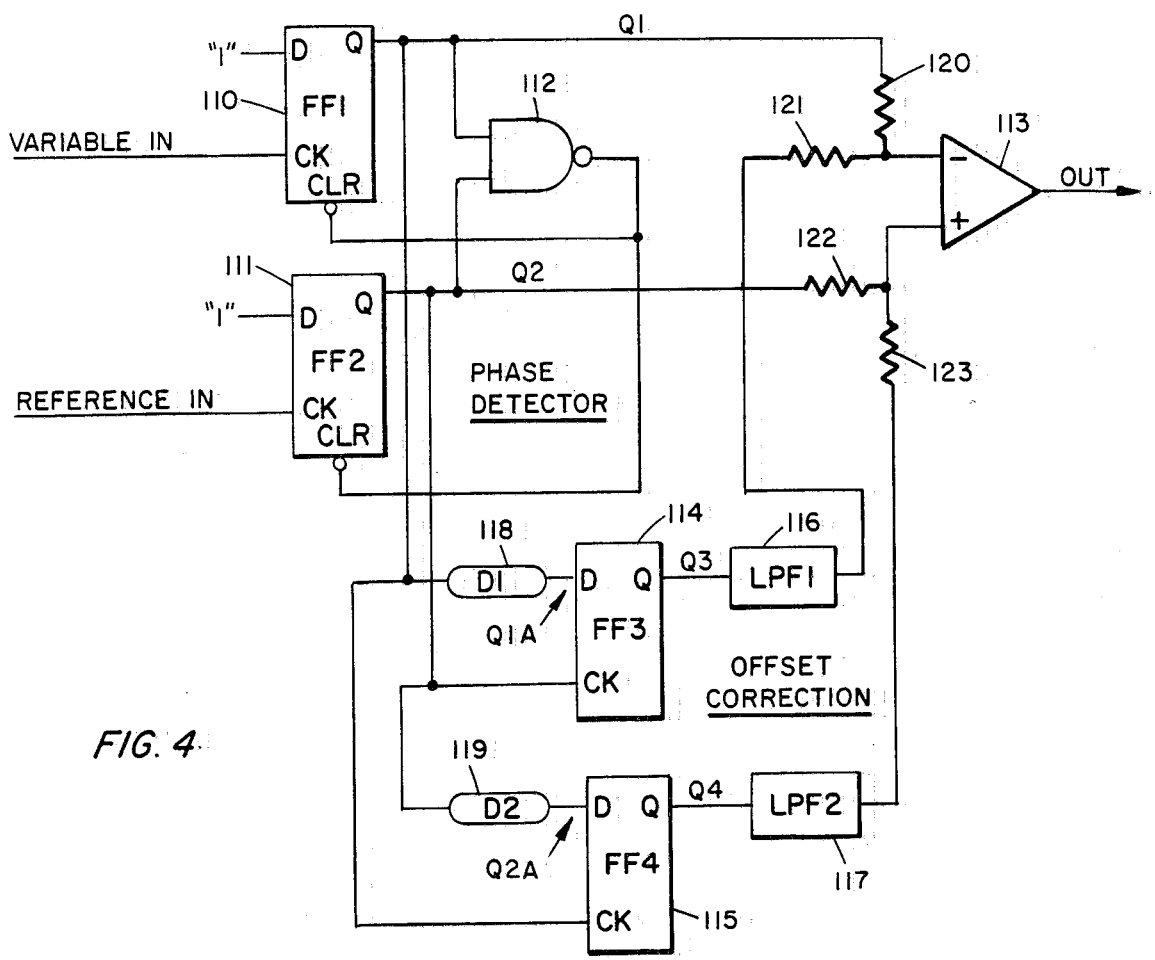
FIG. 4 is a block diagram of the circuit of the instant invention.

Referring now to FIG. 4, there is shown a block diagram of the circuit which forms the invention. The circuit provides an offset voltage correction substantially independent of phase detector error. Again, a variable input signal and a reference input signal are supplied to the clock terminals of D-type flip-flops 110 and 111. The D input terminals of the respective flip-flops are connected to receive a positive (or binary 1) input signal. The output terminals of flip-flops 110 and 111 supply the Q1 and Q2 output signals. The Q terminals of flip-flops 110 and 111 are connected respectively to inputs of NAND gate 112 and to the minus (−) and plus (+) input terminals of amplifier 113 via resistors 120 and 122, respectively. The output of NAND gate 112 is connected to the clear (CLR) terminals of flip-flops 110 and 111.

In addition, the Q output terminal of flip-flop 110 is connected to the D input terminal of flip-flop 114 via delay line 118 as well as to the clock (CLK) terminal of flip-flop 115. In similar fashion, the Q output terminal of flip-flop 111 is connected to the clock (CLK) terminal of flip-flop 114 and to the D terminal of flip-flop 115 via delay line 119. The Q output terminal of flip-flop 114 produces the signal Q3 and is connected to a low pass filter 116 which is connected to the minus (−) terminal of amplifier 113 via resistor 121. In similar fashion, the Q terminal of flip-flop 115 produces the Q4 output signal that is supplied to the low pass filter network 117 which is connected to the plus (+) terminal of amplifier 113 via resistor 123.

The phase detector portion of FIG. 4 operates substantially similar to the phase detector portion of the circuits shown in FIG. 1. However, for simplicity, the feedback path is omitted.

In addition, the Q1 and Q2 signals are connected to the flip-flops 114 and 115 as shown. Thus, the application of the Q1 signal clocks flip-flop 115 to transfer the Q2A signal therethrough to produce output signal Q4. The Q2A signal is a function of the Q2 signal and the delay time of delay line 119. In similar fashion, the Q2 signal, when applied, clocks the flip-flop 114 and thereby transfers the signal Q1A to the Q3 signal as a function of the value of signal Q1 and the delay line 118. This added nulling circuit supplies whatever offset voltage is required to keep the phase error within the prescribed limits.

Figure 5:
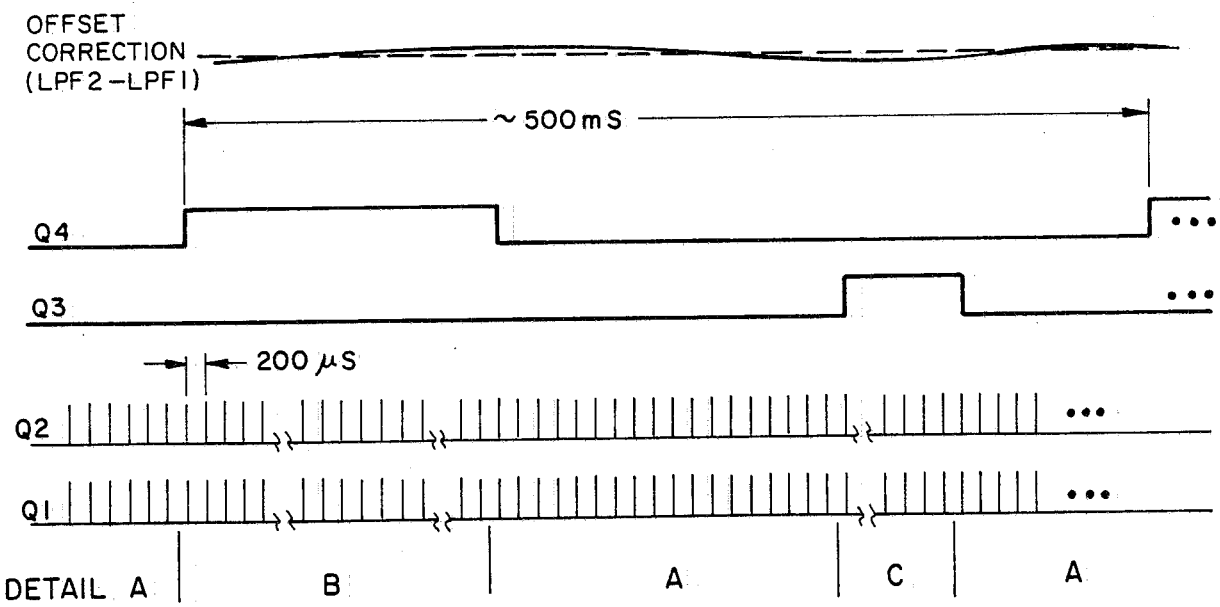
FIGS. 5 through 8 are waveform diagrams representative of the operation of the circuit of the instant invention.

Referring now to FIG. 5, there is shown a diagram of waveforms produced by the circuit of FIG. 4. The Q1 and Q2 signals are shown as occurring frequently with a time spacing therebetween of approximately two hundred microseconds. (The actual time scale is unimportant, per se, and the values given are illustrative only.) The signals Q3 and Q4 are shown in representative fashion as may be produced as a result of the Q1 and Q2 signals. The Q3 and Q4 signals have a time rate of approximately five hundred milliseconds. The offset correction signal is a slowly oscillating signal representative of the difference between the signals produced by low pass filter 117 and low pass filter 116. These signals are shown to illustrate the relative frequency of the several signals. The detailed operation of the circuit as a function of the signal shown in FIG. 5 is shown in subsequent figures. However, because of the relative time scales, FIG. 5 is not sufficiently detailed to provide a meaningful disclosure at this juncture.

Figure 6:
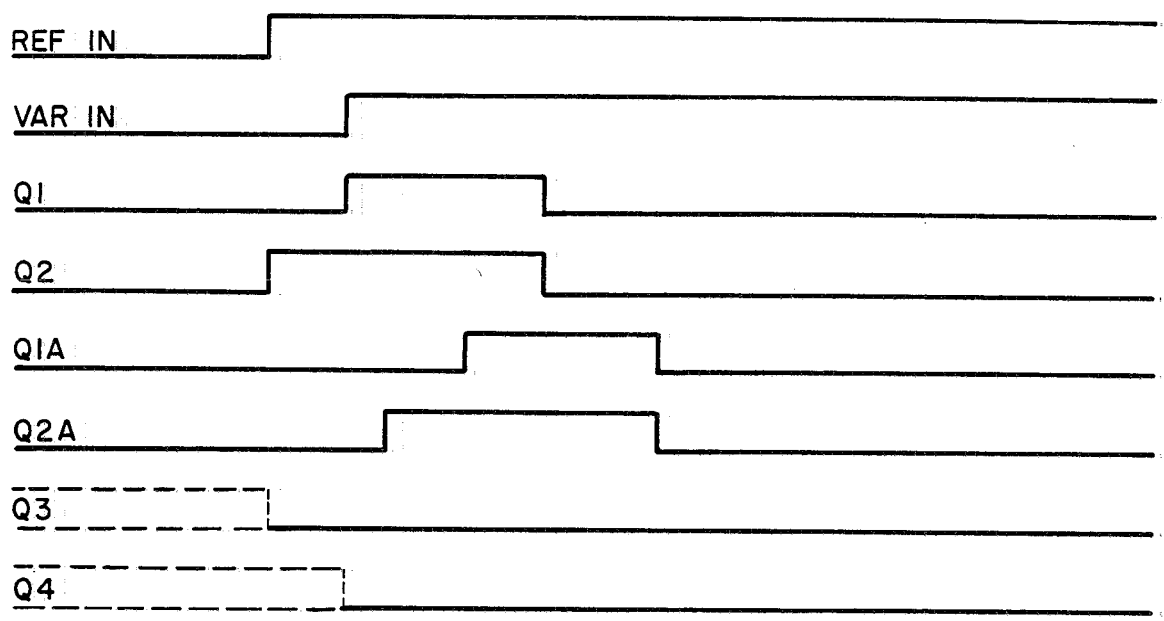

Referring now to FIG. 6, there is shown a circuit operation which is observed during time periods A shown in FIG. 5. In particular, in this instance, the reference input signal and the variable input signal are presented at a minimal time-wise spacing. These signals produce the Q1 and Q2 signals from flip-flops 110 and 111, respectively. The Q1 and Q2 signals also produce the Q1A and Q2A signals at the outputs of delay lines 118 and 119, respectively. However, it will be seen that the Q2 signal is supplied to the clock terminal of flip-flop 114 before the Q1A signal is supplied to the D input terminal thereof. In other words, the difference in starting time (i.e., leading edges) of Q1 and Q2 is not sufficient to overcome the effect of delay line 118. Therefore, flip-flop 114 is not set and signal Q3 remains low.

In a similar fashion, signal Q2A is received after signal Q1 has been applied to flip-flop 115. Consequently, the signal Q4 is not generated. Thus, the signals Q3 and Q4 are either switched low or remain low, as the case may be. Inasmuch as these signals remain low or approximately ground potential, the phase detector operates as before. However, the LPF outputs continue to present voltages to the difference amplifier sufficient to null out all voltage offsets and, therefore, produce nearly zero phase error at the phase dectector.

Figure 7:
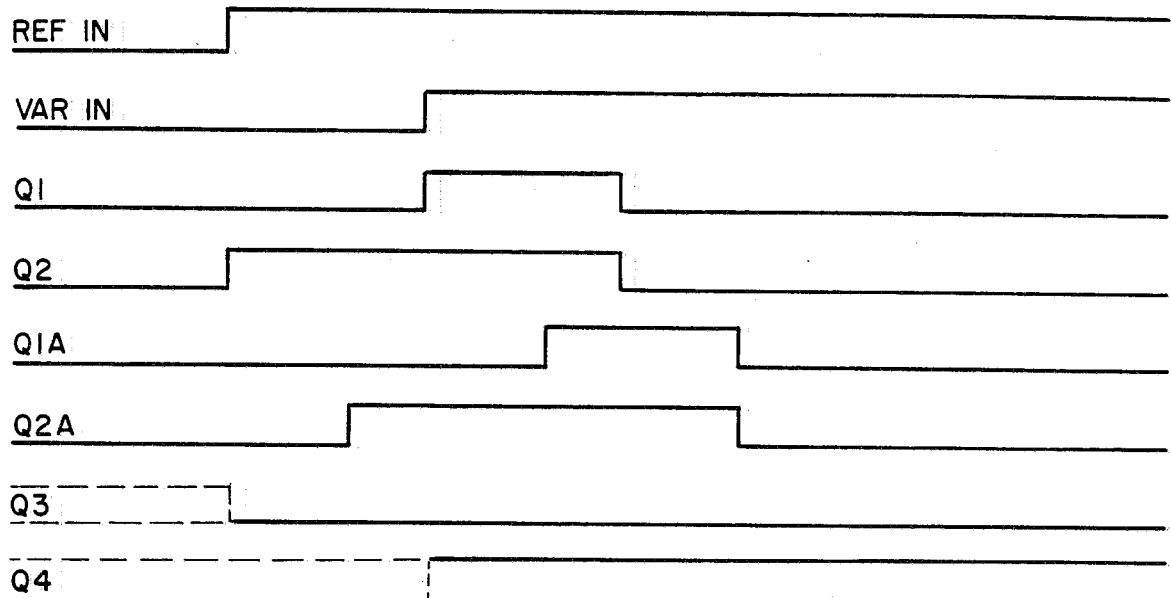

Referring now to FIG. 7, there is shown a situation wherein the reference input signal precedes the variable input signal by a substantial margin. In this case, the Q1 and Q2 output signals are produced by flip-flops 110 and 111, respectively. In addition, the Q2A signal is supplied sufficiently in advance of the Q1 signal that flip-flop 115 is triggered and the output signal Q4 is raised to (or continued at) the high level. The Q3 signal remains low because of the relationship between signals Q1A and Q2. Thus, a signal is supplied to the plus terminal of amplifier 113. This signal (a current signal) is representative of the relationship between the referenced input signal and the variable input signal and provides a certain amount of correction signal to amplifier 113.

Figure 8:
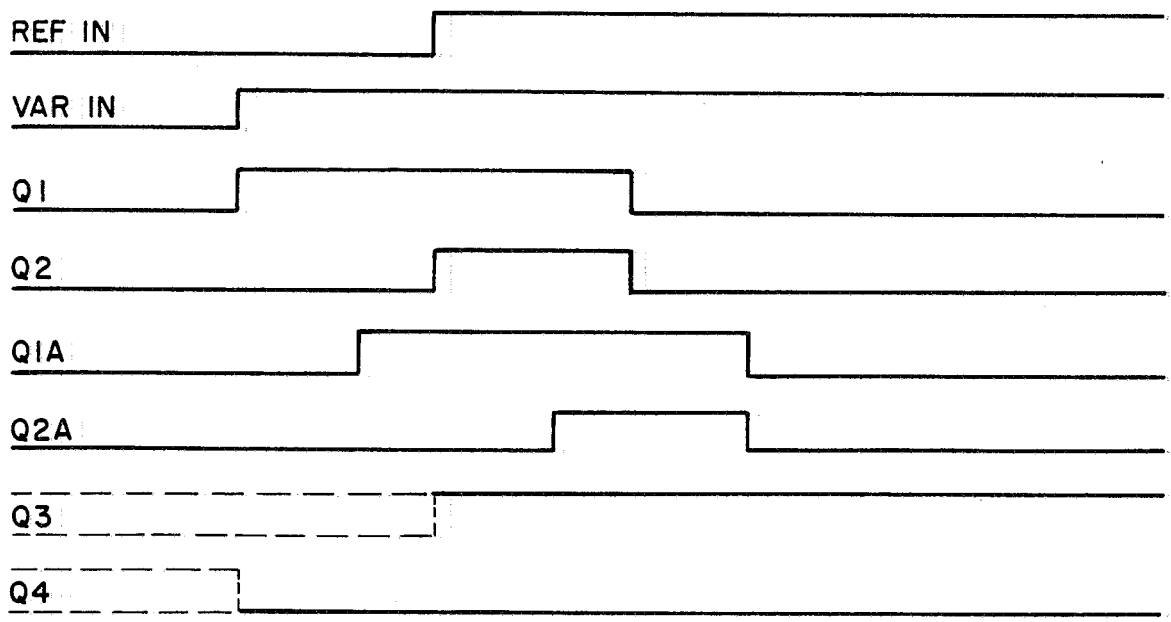

Referring now to FIG. 8, there is shown the reverse situation. That is, the variable input signal leads the reference signal by a significant time amount. In this case, the Q4 signal is not generated but the Q3 signal is generated by flip-flop 114. This signal condition provides a current signal to the minus (−) input terminal of amplifier 113 to produce a correction signal thereat.

Thus, there is shown and described an improved automatic nulling system of a phase detector or phase-locked-loop circuit. This circuit senses the condition wherein the reference and variable input signals are applied at different times. One of the output signals from the offset correction portion of the circuit typically stays high (in this embodiment) so long as the respective output of the phase detector portion is positive when the other signal thereof goes high. Thus, the offset correction portion generates a steady state signal representing a phase error sign while the phase detector signal generates a correction which is proportional to phase error. The low pass filters limit the bandwidth with which the offset correction channel operates. This is desirable because the offset correction channel has much more gain that the phase detector channel. The delays of the delay lines are generally small and are used along with the low pass filter to control the rate and magnitude of the small dead band oscillation around the true null point. The filters and the delays can each be RC circuits or the like. However, other types of circuits are contemplated in this area as well. The embodiments shown and described are intended to be illustrative only. The details therein are not intended to be limitative. The scope of the invention is limited only by the claims appended hereto.

Having thus described a preferred embodiment of the instant invention, whas is claimed is:

1. An automatic offset nulling circuit coimprising,
    phase detector circuit means (110, 111) for receiving a variable input signal and a reference input signal and producing a pair of output signals (Q1, Q2,) representative of the time and phase difference between the respective input signals,
    offset correction circuit means (114, 115, 118, 119) connected for receiving said pair of output signals from said phase detector means and selectively producing a pair of offset correction signals (Q3, Q4) representative of the time and phase difference relationship between said pair of output signals from said phase detector circuit means, and
    combining means (120, 121, 122, 123, 113) connected to receive said pair of output signals (Q1, Q2) from said phase detector circuit means and said offset correction signals (Q3, Q4) from said offset correction circuit means to produce a signal (OUT) representative of the combination of said pair of output signals from said phase detector circuit means and said offset correction signals from said offset correction circuit means.

2. The circuit recited in claim 1 wherein,
    said phase detector circuit means comprises bistable circuit means.

3. The circuit recited in claim 1 wherein,
    said combining means includes difference amplifier means.

4. The circuit recited in claim 1 wherein,
    said offset correction circuit means comprises bistable circuit means.

5. The circuit recited in claim 4 including,
    delay means connected between an output of said phase detector circuit means and the input of said bistable circuit means.

6. The circuit recited in claim 4 including,
    filter means connected between said bistable circuit means and said combining means.

7. The circuit recited in claim 4 wherein,
    said bistable circuit means comprises flip-flop means.

8. The circuit recited in claim 1 wherein,
    said combining means includes first summing means (120, 121) connected for combining one of said output signals (Q1) from said phase detector means and one of said offset correction signals (Q3) from said offset correction circuit means, and
    second summing means (122, 123) connected for combining the other of said output signals (Q2) from said phase detector circuit means and the other of said offset correction signals (Q4) from said offset correction circuit means.

9. The circuit recited in claim 1 wherein,
    said phase detector circuit means is a dual flip-flop phasefrequency detector.

10. The circuit recited in claim 6 wherein,
    said filter means comprise low pass filter circuits.

11. The circuit recited in claim 1 including,
    reset means comprising a NAND gate connected to receive said pair of output signals from said phase detector circuit means and to selectively reset said phase detector means in response to said first pair of output signals.

12. A phase detector circuit with an automatic offset null, comprising,
    phase detector means for detecting the time and phase difference between a pair of input signals (Variable In, Reference In) supplied thereto and producing first and second detector output signals (Q1, Q2) representative of said time and phase difference,
    offset correction means,
    delay means (D1, D2),
    said offset correction means being connected to receive said detector output signals (Q1, Q2) directly from said phase detector means and further connected to receive said detector output signals via said delay means (Q1A, Q2A) to produce offset correction signals (Q3, Q4),
    circuit means connected to receive said detector output signals from said phase detector means and said offset correction signals from said offset correction means and operative to supply control signals to an amplifier means thereby to control the operation of said amplifier means as a function of said detector output signals received from said phase detector means, and,
    amplifier means (113) responsive to said control signals supplied by said circuit means for producing an output signal.

13. The circuit recited in claim 12 wherein,
    said delay means includes a first delay circuit responsive to one of said detector output signals for applying said one detector output signal to said offset correction means, and a second delay circuit responsive to the other detector output signal signal from said phase detector means for applying said other detector output signal to said offset correction means.

14. The circuit recited in claim 12 including,
    filter means connected between said offset correction means and said amplifier means.

15. The circuit recited in claim 12 wherein,
    said phase detector means comprises first and second flip flop means which receive a variable input signal and a reference input signal, respectively, and produce said first and second detector output signals, and said offset correction means comprises third and fourth flip flops means which directly receive said second and first detector output signals, respectively, and which receive said first and second detector output signals respectively, via said delay means, and produce first and second offset correction signals, respectively.

* * * * *